United States Patent [19]

Patel et al.

[11] Patent Number: 5,208,135
[45] Date of Patent: May 4, 1993

[54] PREPARATION AND USE OF DYES

[75] Inventors: Ranjan C. Patel, Little Hallingbury; Tran V. Thien; David Warner, both of Harlow, all of Great Britain

[73] Assignee: Minnesota Mining and Manufacturing Company, St. Paul, Minn.

[21] Appl. No.: 653,358

[22] Filed: Feb. 11, 1991

[30] Foreign Application Priority Data

Feb. 27, 1990 [GB] United Kingdom ............... 9004337

[51] Int. Cl.$^5$ .................. G03F 7/029; C09B 23/00
[52] U.S. Cl. .................. 430/281; 430/914; 430/915; 430/919; 430/926; 430/944; 558/426; 546/347; 522/25
[58] Field of Search ............ 558/426; 546/347; 522/25; 430/914, 915, 919, 926, 944, 281

[56] References Cited

U.S. PATENT DOCUMENTS

| | | | |
|---|---|---|---|
| 862,005 | 5/1969 | Irick, Jr. | 558/426 X |
| 4,632,895 | 12/1986 | Patel et al. | 430/201 |
| 4,701,402 | 10/1987 | Patel et al. | 430/339 X |
| 4,908,040 | 3/1990 | Naef et al. | 558/426 X |

FOREIGN PATENT DOCUMENTS

| | | | |
|---|---|---|---|
| 1-9968 | 1/1989 | Japan | 558/426 |
| 2-201351 | 8/1990 | Japan | 430/944 |

*Primary Examiner*—Cynthia Hamilton
*Attorney, Agent, or Firm*—Gary L. Griswold; Walter N. Kirn; Mark A. Litman

[57] ABSTRACT

Compounds having a utility as photosensitive dyes in photocurable polymer based imaging systems having a nucleus of general formula (I):

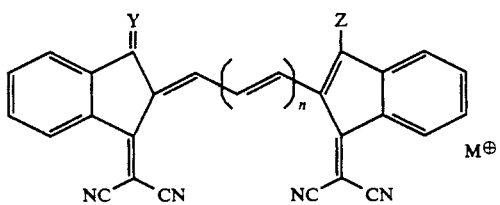

wherein:
n is 1 or 2,
Y is selected from the group consisting of O and

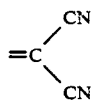

Z is selected from the group consisting of O⊖ and

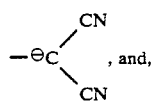

, and,

M⊕ is a cation.

19 Claims, No Drawings

PREPARATION AND USE OF DYES

FIELD OF INVENTION

This invention relates to a class of dyes and in particular to their preparation and use in photocurable polymer based imaging materials.

BACKGROUND TO THE INVENTION

The ready availability of commercial red and infra-red light emitting diodes and laser diodes for imaging systems has stimulated the development of imaging materials sensitive to the output wavelengths of these devices. Imaging materials may be broadly grouped into either silver halide or non-silver halide based materials. Whereas silver halide based materials have frequently been sensitised to the infra-red, non-silver halide materials (with the exception of electrophotographic materials) have rarely been sensitised to the infra-red. A common form of non-silver imaging involves photocuring of unsaturated resins. This is used extensively in printing and proofing, for example, by exploiting the different physical properties of the cured and uncured resin. Images are revealed, e.g., by differential dissolution in developer, by differential adhesion of coloured toner, by differential adhesion to a carrier sheet etc. Normally, such materials comprise a suitable resin, an initiator and a sensitiser, although the last two may be combined in a single molecule. The function of the sensitiser is to absorb incident radiation and transfer energy to the initiator, which then fragments into reactive species that initiate curing of the resin.

The most commonly used sensitisers respond to relatively short wavelength (high energy) light, e.g., 350 to 420 nm, so that relatively large amounts of energy per absorbed quantum can be transferred to the initiator. The latter can therefore be a thermally stable compound, with good shelf-life. Examples of such systems are found in, for example, British Published Patent Applications Nos. 2111232A, 2112536A and 2113860A. At longer wavelengths, the energy available per absorbed quantum decreases correspondingly, until there is insufficient energy to cause fragmentation of any but the most unstable of initiators, which then have a very limited shelf life.

Japanese Patent Applications Nos. 63-208036 and 63-274592 disclose the combination of infra-red absorbing polymethine or squarylium dyes with an organic peroxide and curable resin. Heat generated through absorption of infra-red radiation causes decomposition of the peroxide and curing of the resin, the materials being imageable by semiconductor laser.

European Published Patent Application No. 223857 and Japanese Patent Applications Nos 1-013139 to 1-013144 disclose the combination of a cationic dye and organoborate salt as photoinitiator. Sensitivity throughout the visible region is possible, but infra-red sensitivity is not disclosed.

Iodonium salts are known as initiators in photo-curing systems. They are most commonly sensitised to the 350 to 420 nm region, but recent publications such as U.S. Pat. No. 4,828,583 and European Published Patent Application No. 290133 disclose sensitisation up to 660 nm. These publications also teach the additional benefit of including an electron donor compound having an oxidation potential greater than zero but less than or equal to that of p-dimethoxybenzene. Improvements in the rate and depth of cure are described. In both U.S. Pat. No. 4,828,583 and European Published Patent Application No. 290133, the sensitising dyes are restricted to those materials which sensitise 2-methyl-4,6-bis(trichloromethyl)-s-triazine.

The combination of iodonium salts and oxonol dyes is disclosed in U.S. Pat. Nos. 4,701,402 and 4,632,895. The systems described are photobleaching and there is no disclosure of photopolymerisation.

A class of dyes, particularly oxonol dyes, has now been found which have a particular utility as photosensitiser dyes in photocurable polymer based imaging systems.

SUMMARY OF THE INVENTION

According to one aspect of the present invention there is provided a compound having a nucleus of general formula (I):

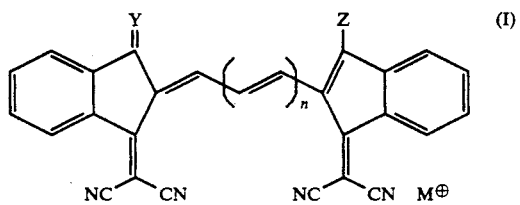

wherein:

n is 1 or 2,

Y is selected from the group consisting of 0 and

Z is selected from the group consisting of $0^{\ominus}$ and

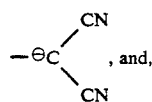, and, $M^{\oplus}$ is a cation.

The dyes of formula (I) absorb strongly in the wavelength range 630 to 900nm, generally 750 to 850 nm, with a relatively sharp absorption peak, and have a particular utility as sensitising dyes for promoting the photopolymerisation of a free-radical curable resin in combination with an iodonium salt.

Therefore according to a further aspect of the present invention there is provided a photosensitive element comprising a layer of a photocurable composition comprising (a) a compound of general formula (I), (b) an iodonium salt, and (c) a free-radical curable resin. In one embodiment of the invention, the photocurable composition may advantageously comprise a triarylphosphine as an activator therefor.

The photosensitive elements of the invention find various applications in imaging technologies such as proofing elements, relief image and lithographic printing plates and resists for etching. The combination of iodonium salt, dyes of general formula (I) and free-radical curable resin is found to produce photocurable compositions having an improved resistance to thermalmediated dye bleaching. Consequently, photosensitive elements incorporating such compositions are found to have an extended shelf life stability when compared with many photosensitive elements of the prior art.

DESCRIPTION OF THE PREFERRED EMBODIMENTS

Compounds within the scope of general formula (I) comprise trimethine and pentamethine oxonol dyes. Generally, if Y represents 0 then Z represents $O^{\ominus}$ and if Y represents

then Z represents

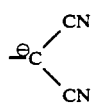

Each terminal phenyl group of the dye molecule may additionally possess one or more further substituents, especially electron withdrawing substituents, such as nitro, cyano, trifluoromethyl and sulphone moieties, alkoxycarbonyl groups comprising up to 5 carbon atoms etc., although other groups, such as halogen atoms, alkyl groups comprising up to 20 carbon atoms, aryl groups comprising up to 10 carbon atoms and heterocyclic group substituents are also useful.

The polymethine chain may optionally possess one or more substituents known in the art of oxonol dye synthesis, e.g., halogen atoms, cyano groups, alkyl groups comprising up to 5 carbon atoms, etc. When n =2, three adjacent carbon atoms in the polymethine chain may form a part of a cyclic bridging group such as a cyclopentene or cyclohexene ring, optionally bearing substituents such as halogen atoms, alkyl groups comprising up to 5 carbon atoms and aryl groups comprising up to 10 carbon atoms, e.g., phenyl etc.

A preferred class of dyes has a nucleus of the following general formula (II):

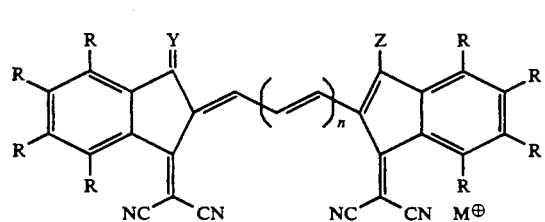

(II)

in which:

Y, Z and $M^{\oplus}$ are as defined above, and, each R group independently represents a hydrogen atom or a nitro group.

The dye anion is associated with a cation $M^{\oplus}$ which may comprise any suitable cation known to the art of oxonol dye synthesis. $M^{\oplus}$ is generally selected from: $K^{\oplus}$, $N^{\oplus}H(C_2H_5)_3$, $N^{\oplus}H(C_4H_9)_3$, $N^{\oplus}H(C_8H_{17})_3$, $N^{\oplus}H(C_{18}H_{37})_3$, $$N^{\oplus}H(C_4H_9)_2, \quad N^{\oplus}H(C_9H_{19})_2$$
$$\underset{C_{12}H_{25}}{|} \quad \underset{C_{18}H_{37}}{|}$$

and pyridinium.

$M^{\oplus}$ is preferably pyridinium or a long chain aliphatic ammonium ion containing at least 6 carbon atoms as this is found to improve dye solubility.

Preferred examples of dyes comprise:

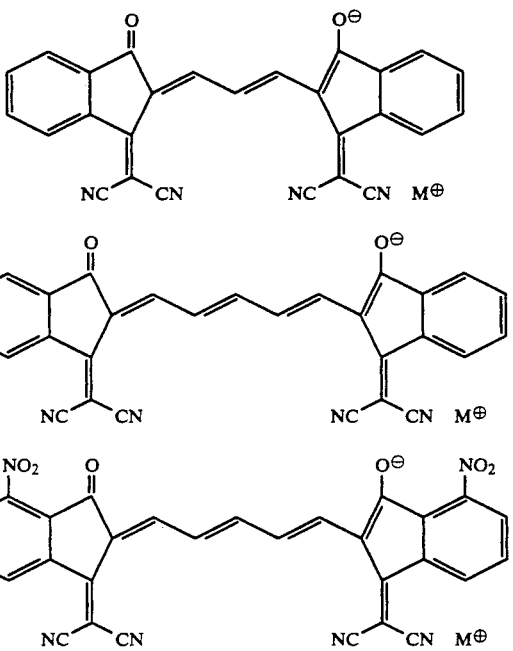

The iodonium salt may comprise any of the iodonium salts known to the art, for example, those iodonium salts utilised in the oxonol dye bleaching systems disclosed in U.S. Pat. No. 4,701,402.

Iodonium salts are compounds having a positively charged iodine atom bearing two covalently bonded carbon atoms and any anion. Aliphatic iodonium salts are not normally thermally stable at temperatures above 0° C. However, stabilised alkyl phenyl iodonium salts such as those disclosed in *Chemical Letters* (1982) pp. 65–6 are stable at ambient temperatures and may be used in the invention. The preferred compounds are diaryl and arylheteroaryl iodonium salts in which the carbon-to-iodine bonds are from aryl or heteroaryl groups.

Suitable iodonium salts may be represented by the formula:

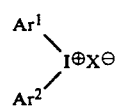

in which;

$Ar^1$ and $Ar^2$ independently represent aromatic groups include the iodine atom within a ring structure, and, $X^{\oplus}$ represents an anion.

These aromatic groups generally comprise from 4 to 20 carbon atoms, may be selected from aromatic hydrocarbon rings, e.g., phenyl or naphthyl and heteroaromatic groups including thienyl, furanyl and pyrazolyl, and may be substituted with alkyl groups, e.g., methyl, alkoxy groups, e.g., methoxy, chlorine, bromine, iodine, fluorine, carboxy, cyano or nitro groups, or any combinations thereof. Condensed aromatic-heteroaromatic groups, e.g., 3-indolinyl, may also be present.

The ortho positions of the aryl groups may be linked together to include the iodine atom within a ring structure to give a formula such as:

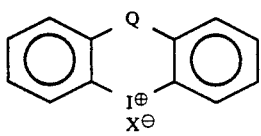

in which;

Q is an oxygen or sulphur atom and X⊖ is as defined earlier.

Other suitable iodonium salts include polymers containing the monomeric unit:

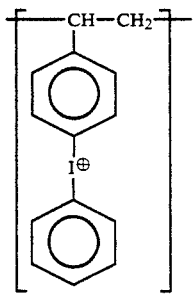

Many anions are known to be useful as the counter-ion (X⁻) in the iodonium salt. Preferably the acid from which the anion is derived has a pKa<5. Suitable inorganic anions include halide anions, HSO₄⊖, and halogen-containing complex anions, e.g., tetrafluoroborate, hexafluorophosphate, hexafluoroarsenate and hexafluoroantimonate. Suitable organic anions include those of the formulae:

$$R^1COO^\ominus \text{ and } R^1SO_3^\ominus$$

in which;

R¹ is an alkyl group or aryl group, e.g., a phenyl group, either of which may be substituted. Examples of such anions include CH₃COO⊖ and CF₃COO⊖.

The most significant contribution of the anion is its effect upon the solubility of the iodonium salt in different solvents or binders.

Examples of useful iodonium salts are:

| Example | Iodonium cation | Anion |
|---|---|---|
| A | 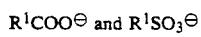 | PF₆⊖ |
| B | H₃C—⌬—I⊕—⌬—CH₃ | PF₆⊖ |
| C | Cl—⌬—I⊕—⌬—Cl | PF₆⊖ |
| D | (CH₃)(H₃C)—⌬—I⊕—⌬—(CH₃)(CH₃) with H₃C, CH₃ substituents | PF₆⊖ |
| E | H₃C—⌬—I⊕—⌬—CH₃ | Cl⊖ |
| F | ⌬—I⊕—⌬ | Br⊖ |
| G | ⌬—I⊕—⌬ | SbF₆⊖ |
| H | (thienyl-S)—I⊕—⌬ | CF₃CO₂⊖ |
| I | O₂N—⌬—O—⌬—NO₂ with central I⊕ | PF₆⊖ |
| J | ⌬—I⊕—⌬—O(CH₂)₃CH₃ | CF₃CO₂⊖ |

The free-radical curable resin may comprise any free-radical curable resin known to the art, although preferred resins comprise a film forming polymer (e.g., cellulose esters, poly(vinyl butyral) etc.) and one or more polymerisable monomers, including at-least one polyfunctional monomer. Preferred resins comprise pentaerythritol tetraacrylate as a polyfunctional monomer either alone or in combination with polyethylene oxide-bis-acrylate, commercially available from Ancomer Chemicals. Generally, the free-radical curable resin comprises from 0 to 70%, preferably 10 to 60%, by weight of film forming polymers and oligomers and from 30 to 100%, preferably 40 to 90%, by weight of ethylenically unsaturated monomers and oligomers.

Generally, the photocurable composition comprises:

(i) Compound of general formula (I) - from 1 to 10% by weight of the total composition weight;
(ii) Iodonium salt—from 1 to 20% by weight of the total composition weight, and
(iii) Free-radical curable resin—from 70 to 98% by weight of the total composition weight.

There is an optimum level for balancing the iodonium salt concentration with the concentration of Compound (I) in each resin to achieve the best balance between the rate of photocuring and the greatest differential between exposed and non-exposed areas with respect to solvent resistance. If the ratio of iodonium ion to Compound (I) in the resin falls too low, then the exposed coating may not have sufficient resistance to developer attack and conversely if the ratio is too high, then the photocuring process may spread to adjacent unexposed areas.

The photocurable composition may also advantageously comprise a triarylphosphine, e.g., triphenylphosphine, as an activator, generally in an amount up to 15%, preferably up to 10%, of the total composition weight.

Such compounds are known in the art and are represented by general formula (III):

in which;
each Ar independently represents an aryl group, e.g., phenyl, naphthyl, furanyl, pyrazolyl, generally comprising up to 10 carbon atoms, each of which groups may optionally possess one or more substituents selected from halogen atoms, $NO_2$, hydroxyl, ether groups comprising up to 5 carbon atoms, amines and alkyl groups comprising up to 5 carbon atoms, e.g., methyl, ethyl etc. The aryl groups represented by Ar may also possess one or more water-solubilising groups, such as sulphonates, sulphonic acid, sulphonic acid esters, sulphonic acid salts (with an associated cation such as alkali metal cations), carboxylates, carboxylic acid, carboxylic acid esters, carboxylic acid salts (again with an associated cation such as alkali metal cations), hydroxy-alkyl groups generally comprising up to 3 carbon atoms, phosphates, phosphonates, phosphites and phosphines, to assist formulation of the triarylphosphine in the photocurable composition.

Examples of triarylphosphines suitable for use in the present invention which are reported in the literature and/or commercially available include the following:
triphenylphosphine,
p-(diphenylphosphino)benzoic acid,
sodium diphenylphosphinobenzene-m-sulphonate,
tri-(p-[methyl ester sulphonic acid]-phenyl) phosphine,
m-(diphenylphosphino)benzoic acid,
(p-carbomethoxyphenyl)diphenylphosphine,
o-(diphenylphosphino)benzoic acid,
3,3'-(phenylphosphinidene)dibenzoic acid,
4,4'-(phenylphosphinidene)dibenzoic acid,
4,4',4''-phosphinidenetribenzoic acid,
3,3',3''-phosphinidenetribenzoic acid, and
4,4',4''-phosphinidenetribenzoic acid trimethyl ester.

Preferably, the triarylphosphine is triphenylphosphine.

Photocurable compositions comprising triphenylphosphine show greatly enhanced sensitivity over those without it.

The photocurable composition may contain other ingredients such as stabilising additives, inert colourants, surfactants, lithographic printing aids, e.g., tung oil. Generally, the total amount of such additive ingredients (other than solvents) does not amount to more than 50% based on the total weight of the photocurable composition.

Photosensitive elements in accordance with the invention are prepared by coating a suitable substrate or support with a layer of the photocurable composition. The photocurable composition is generally coated from a suitable solvent using techniques known in the art. Exemplary substrates include fibre based materials such as paper, poly(ethylene)-coated paper, poly(propylene)-coated paper, parchment, cloth and the like; sheets and foils of metals such as aluminium, copper, magnesium and zinc; glass and glass coated with metals such as chromium, chromium alloys, steel, silver, gold and platinum; synthetic polymeric materials such as poly(alkyl methacrylates), e.g., poly(methyl methacrylate), polyesters, e.g., poly(ethylene terephthalate), poly(vinyl acetals), polyamides, e.g., nylon, cellulose esters, e.g., cellulose nitrate, cellulose acetate, cellulose acetate propionate, cellulose acetate buyrate, and the like.

Typical lithographic support materials which are useful in the invention include supports such as zinc, anodized aluminium, grained aluminium, copper and specially prepared metal and paper supports; superficially hydrolysed cellulose ester films; polymeric supports such as polyolefins, polyesters, polyamide and the like.

The supports can be sub-coated with known subbing materials such as copolymers and terpolymers of vinylidene chloride with acrylic monomers (such as acrylonitrile and methyl acrylate) and unsaturated dicarboxylic acids (such as itaconic acid or acrylic acid); carboxymethyl cellulose, polyacrylamide; and similar polymeric materials.

The support can also carry a filter or antihalation layer, such as one comprising a dyed polymer layer which absorbs the exposing radiation after it passes through the photocurable layer and eliminates unwanted reflection from the support.

The photosensitive elements of the invention may optionally comprise an inert barrier layer coated on top of the radiation-sensitive layer. Alternatively, a transparent plastic film may be laminated on top of the photocurable layer. Such barrier materials have the beneficial effect of preventing access of atmospheric oxygen to the resin layer, so that oxygen-inhibition of the photocuring process is minimised. Suitable barrier materials include coatings of water-soluble polymers such as gelatin and poly(vinyl alcohol) (PVA), optionally containing one or more surfactants, and laminated flexible sheets of transparent plastic (e.g. polyester), optionally treated with surfactants or release coatings.

Image-wise exposure of the photosensitive elements can be carried out using a wide range of sources that emit near infra-red radiation. These include tungsten filament bulbs, xenon arc lamps, He-Ne lasers, laser diodes and light-emitting diodes (LED's). Lasers and LED's are particularly attractive in that they can be used to output electronically-stored image information. This involves irradiating the photosensitive element with very short pulses of radiation as the exposing device scans its entire area. Alternatively, the photosensitive elements can be exposed to a continuous source through an appropriate mask.

Following exposure, a variety of methods are available for developing the image. The barrier material (if used) is first removed by peeling or washing. In certain circumstances (e.g. by appropriate choice of binder, monomers and surfactants), it is possible for a barrier sheet to adhere preferentially to the cured (or uncured) areas of the photocurable composition, so that peeling of the barrier sheet causes physical separation of the cured and uncured portions of the composition into negative and positive versions respectively of the desired image.

Most commonly, the photocurable composition is designed so that uncured areas are tacky, and cured areas non-tacky. Development then involves application of coloured toner powder, which adheres preferentially to the uncured areas and thus reveals a positive image This method is particularly suitable for colour proofing applications, similar to the well-known Du Pont proofing system sold under the trade mark "Chromalin".

A further method of development involves selective dissolution of the uncured areas in a suitable developer, leaving a negative image. The choice of developer will be governed by the chemical constitution of the resin, but common organic solvents, such as acetone, lower alcohols, chlorinated hydrocarbons etc., have the most general utility. By appropriate choice of resin ingredients, water-based developers, e.g., aqueous alkaline solutions may also be used. This type of development is commonly used when the photosensitive elements of the invention are being used as photoresists, e.g., in the fabrication of printing plates, printed circuits, integrated circuits and the like.

The dyes of formula (I) may be prepared according to the following generalised reaction scheme:

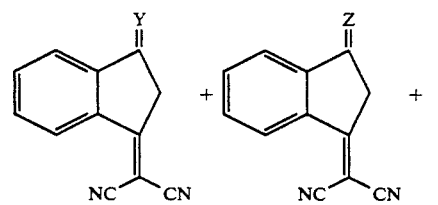

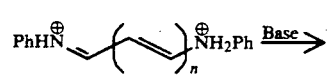

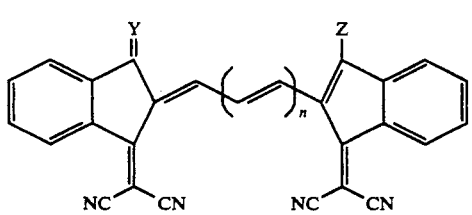

in which:

Y and Z are as defined earlier.

The dicyanovinyl ketomethylene precursor may be prepared using synthesis protocols known in the art from the condensation of indandione and malononitrile (CH$_2$(CN)$_2$).

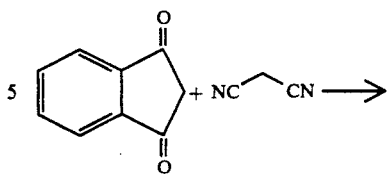

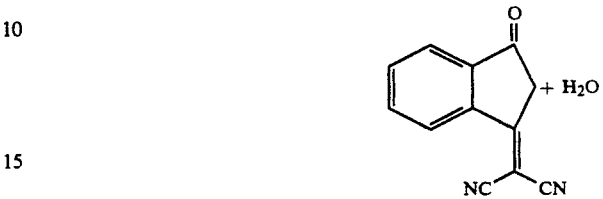

Precursors in which Y and/or Z represent an additional dicyanovinyl group may be prepared according to the following reaction scheme:

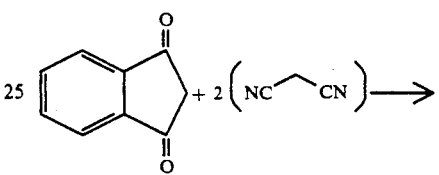

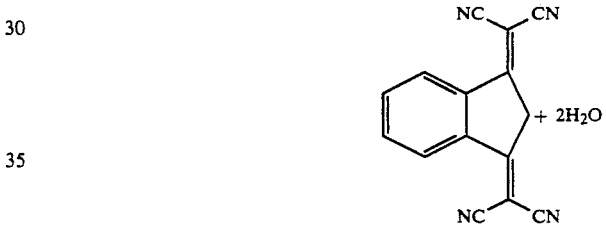

The invention will now be illustrated by the following Examples in which Dyes A to C of the invention are of the following structure:

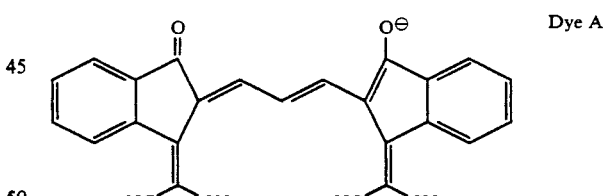

Dye A

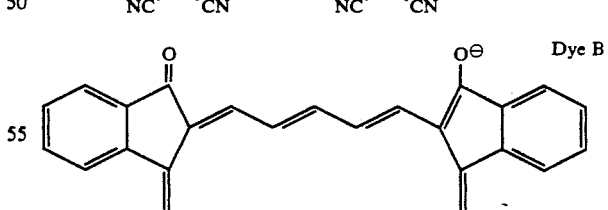

Dye B

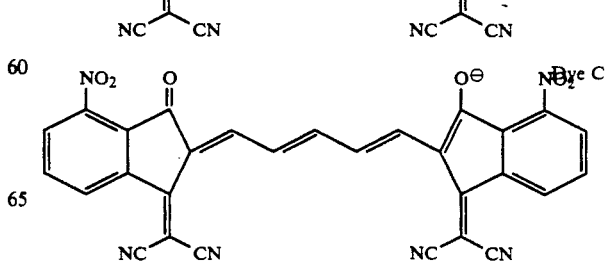

Dye C

Dye A was formulated as the triethylammonium salt, and Dyes B and C as their trioctadecylammonium salts. Control dyes were of the following structure:

Control Dye 1

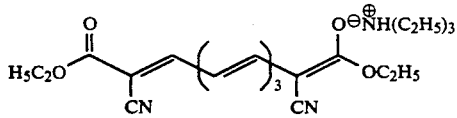

Control Dye 2

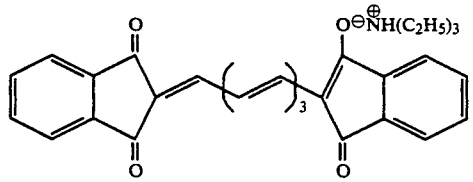

and were prepared by analogous methods.

EXAMPLE 1

Preparation of Dye A

To a boiling mixture of 1,1-dicyanomethylene-3-indanone (1.94 g, 10mM) and anilino acrolein anil dihydrochloride (1.3 g, 5mM) in ethanol (30 ml), was added triethylamine (5 ml). The mixture was refluxed for 1 hour and allowed to cool. The resulting precipitate was filtered and washed repeatedly with acetone and ether, before recrystallisation from a mixture of dimethylformamide/diethylether to obtain a blue-black powder (Yield for Dye A=4.4 g (85%)).

EXAMPLE 2

Trioctadecylamine for use in the synthesis of Dye B was prepared by refluxing for 2 hours a mixture of octadecylamine (2.7 g, 10mM), 1-bromooctadecane (10 g, 30 mM) in dimethylformamide, in the presence of sodium carbonate (2 g). The resulting mixture was allowed to cool before pouring over water (500ml) to precipitate an oil. The precipitated oil was extracted with diethylether and evaporated. Excess 1-bromooctadecane was distilled off under vacuum to leave a viscous amber oil which solidified as a wax upon cooling.

Preparation of Dye B

A mixture of 1,1-dicyanomethylene-3-indanone (1.94 g, 10mM), glutaconaldehyde anil dihydrochloride (1.36 g, 5mM), trioctadecylamine (23.2 g, 15mM) in tetrahydrofuran (50 ml), and ethanol (20 ml), was refluxed for 2 hours and allowed to cool. The mixture was diluted with diethylether (50 ml) and the resulting precipitate filtered and washed repeatedly with diethylether. The precipitate was recrystallised from dichloromethanediethylether to obtain a black powder (Yield for Dye B =7.3 g (60%)).

EXAMPLE 3

Preparation of Dye C

The protocol described in Example 2 for the preparation of Dye B was repeated using an initial mixture of 4-nitro-1,1-dicyanomethylene-3-indanone (2.4 g, 10mM), glutaconaldehyde anil dihydrochloride (1.36 g, 5mM) and trioctadecylamine (23.2 g, 15mM).

EXAMPLE 4

The ability of Dye C of the invention and Control Dyes 1 and 2 to sensitise acrylate polymerisation was evaluated by the following protocol.

A solution of Dye C (0.1g), pentaerythritol tetraacrylate monomer (0.6g), commercially available from Ancomer Chemicals under the trade designation ATM 11, 4-butoxyphenyl phenyl iodonium trifluoroacetate (0.125g) shown below as IOD J, and poly(vinyl butyral) (Butvar B-76) (0.6 g), was made in butanone (95 g) in conditions of diminished light.

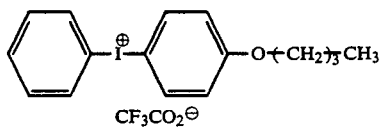

IOD J

The solution was coated onto 0.01 cm unsubbed poly(ethylene terephthalate) (PET) base at a wet thickness of 24μm and dried. A laminate was prepared by covering the monomer coating with a second 0.01 cm PET sheet by cold pressure rolling. The laminate was imagewise exposed to a 250W tungsten light source for 30 seconds using the stage of an overhead projector. Polymerisation of acrylate monomer was shown to occur in the exposed areas of the monomer coating, but not in unexposed areas. Stripping of the cover sheet was more readily completed in exposed areas, whereas, in unexposed areas the monomer coatings partially adhered to the cover sheet. The latent image was developed by immersion in acetone, wherein exposed areas remained adhered to the PET base and unexposed areas were rapidly dissolved to obtain a relief image. The experiment was repeated using Control Dyes 1 and 2 but no evidence of polymerisation was obtained. A complete loss of dye optical density (OD) occurred upon irradiation, with very little differentiation between exposed and non-exposed areas; both areas were readily dissolved in acetone.

Storage of a laminate incorporating Dye C in a light tight envelope for 7 days at room temperature prior to exposure, produces a monomer coating with unchanged imaging characteristics. However, both Control Dyes 1 and 2 are readily bleached during storage with an 80% loss of dye density in less than 24 hours. Thus the dyes of the invention show increased stability compared with the control dyes.

The results are summarised in Table 1 below:

TABLE 1

| Dye | λmax (nm) | Acetone Solubility | | Dye Stability* | |
|---|---|---|---|---|---|
| | | Before Exposure | After Exposure | OD at Day 0 | OD at Day 7 |
| C | 815 | Yes | No | 0.8 | 0.8 |
| 1 | 650 | Yes | Yes | 1.3 | 0.1 |
| 2 | 760 | Yes | Yes | 1.5 | 0.1 |

*Storage is conducted in a light-tight envelope at room temperature.

EXAMPLE 5

A further protocol to test the ability of Dyes B and C of the invention to sensitise polymerisation is described below. Controls were provided by Control Dyes 1 and 2.

To 10 ml cellulose acetate butyrate (10%) in methylethylketone was added Dye B (0.1 g), pentaerythritol tetraacrylate monomer (1.0 g), polyethylene oxide-bisacrylate (0.5 g), commercially available under the trade designation ATM 5 from Ancomer Chemicals, and dimethylsulphoxide (0.5 g). The resulting mixture was stirred for 1 hour at room temperature before addition of IOD J (see Example 4, 0.2 g) in conditions of diminished lighting.

The solution was coated using K-bar 3 onto unsubbed 0.01 cm PET base and the resulting coating dried for 1 hour at 30° C. ("K-bars" are wire wound coating rods manufactured by R.K. Print-Coat Instrument Ltd.) The dried coating was topcoated with an aqueous solution of poly(vinyl alcohol) (8%) containing Tergitol TMN-10, commercially available from Union Carbide, using K-Bar 8 (10 ml 8% poly(vinyl alcohol) containing 1 ml 10% Tergitol TMN-10). The top coating was dried for 12 hours at 30° C. to provide a PVA oxygen-impermeable barrier layer over the photopolymer layer. The inclusion of a PVA barrier layer provides a more controlled imaging element for the evaluation of dye sensitised photopolymerisation than the composite of the previous Example. Spectroscopic examination of the coating indicated that Dye B provided an OD of 0.39 at the absorption maximum of 803 nm.

The two layer coating was irradiated by a laser diode of 2mW laser power and output wavelength of 820 nm, focussed to a 10μm spot with 1 millisecond dwell time. The top PVA barrier layer was stripped off and the photopolymer layer dusted with toner powder which was found to attach to unirradiated areas only. Tracks 100μm wide were observed.

The experiment was repeated using Dye C of the invention with comparable results. Control Dyes 1 and 2 did not promote polymerisation, and upon storage at room temperature (using the light-tight envelope described in Example 4) lost substantially all optical density after a 24 hour storage period due to thermal bleaching.

EXAMPLE 6

This Example demonstrates the speed enhancement available by incorporating triphenlyphosphine into the photocurable layer. The following solution was prepared in conditions of diminished light:

| | |
|---|---|
| Cellulose acetate butyrate (10% w/w solution in butanone) | 20 ml |
| Dye B | 0.2 g |
| ATM 11 | 1.0 g |
| ATM 5 | 0.5 g |
| IOD J | 0.4 g |

This solution was divided in two, with triphenylphosphine (0.2 g) added to one half. Both solutions were then coated on polyester base as described in Example 5. A PVA top coat was applied to each coating again as described in Example 5. Laser imaging was carried out as described in Example 5 except that the laser was adjusted to scan 1.5 cm lines at various scan speeds. The minimum scan time required to destroy tackiness was recorded and found to be 30 seconds for the coating lacking triphenylphosphine and 0.5 seconds for the coating with triphenylphosphine thereby producing a 60-fold speed enhancement.

"Tergitol", "ATM 5", "ATM 11", "Butvar", "Chromalin" are all trade names.

We claim:

1. A compound having a nucleus of general formula (I):

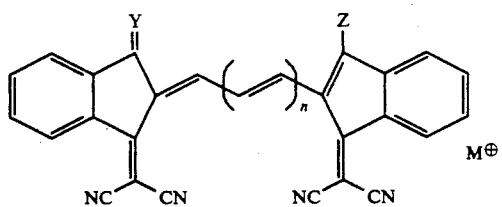

wherein:

n is 1 or 2,

Y is selected from the group consisting of O and

Z is selected from the group consisting of O$^\mp$ and

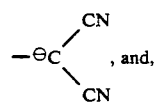, and,

M$^\oplus$ is a cation.

2. A compound according to claim 1 having a nucleus of general formula (II):

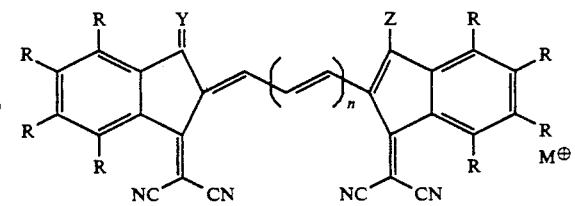

wherein:

n is 1 or 2,

Y is selected from the group consisting of O and

Z is selected from the group consisting of O$^\ominus$ and

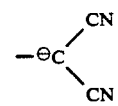

M$^\oplus$ is a cation and each R is independently selected from the group consisting of hydrogen and NO$_2$.

3. A compound according to claim 2 having a nucleus of one of the following structures:

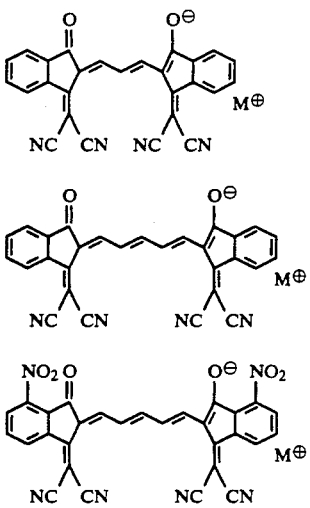

wherein:

M⊕ is selected from the group consisting of K⊕, N⊕H(C₂H₅)₃, N⊕H(C₄H₉)₃, N⊕H(C₈H₁₇)₃, N⊕H(C₁₈H₃₇)₃, $$\begin{array}{cc} N^{\oplus}H(C_4H_9)_2, & N^{\oplus}H(C_9H_{19})_2 \\ | & | \\ C_{12}H_{25} & C_{18}H_{37} \end{array}$$

and pyridinium

4. A photosensitive element comprising a layer of a photocurable composition comprising:

(a) a compound having a nucleus of general formula (I):

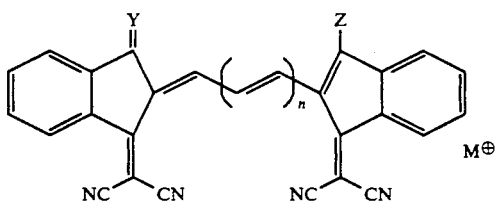

wherein:

n is 1 or 2,

Y is selected from the group consisting of O and

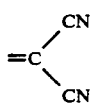

Z is selected from the group consisting of O⊖ and

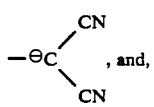, and,

M⁺ is a cation.

(b) an iodonium salt, and (c) a free-radical curable resin.

5. A photosensitive element according to claim 4 wherein the compound of formula (I) comprises from 1 to 10% by weight of the total weight of the composition;

the iodonium salt comprises from 1 to 20% by weight of the total weight of the composition, and the resin comprises 70 to 98% by weight of the total weight of the composition.

6. A photosensitive element according to claim 4 wherein the photocurable composition comprises a triarylphosphine.

7. A photosensitive element according to claim 6 wherein the triarylphosphine comprises up to 15% by weight of the total weight of the composition.

8. A photosensitive element according to claim 6 wherein the triarylphosphine is triphenylphosphine.

9. A photosensitive element according to claim 4 wherein the iodonium salt comprises a cation selected from the group consisting of:

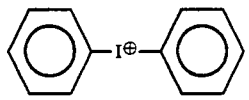

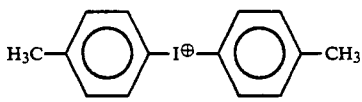

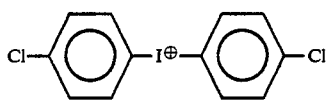

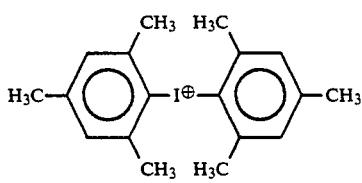

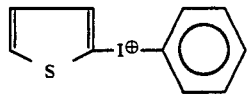

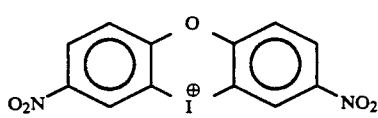

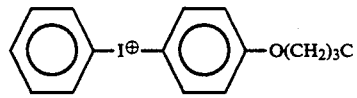

and an anion selected from the group consisting of: Cl⊖, Br⊖, SbF₆⊖, PF₆⊖, CF₃CO₂⊖, AsF₆⊖, HSO₄⊖, CF₃SO₃⊖, BF₄⊖ and C₇H₇SO₃⊖.

10. A photosensitive element according to claim 4 further comprising a barrier layer overlaying the photocurable composition.

11. A compound having the formula:

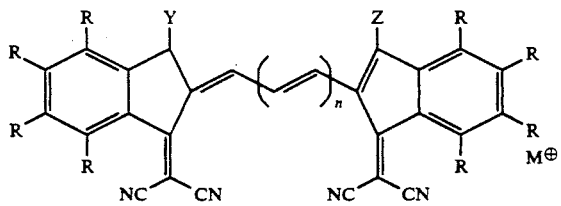

wherein:
n is 1 or 2,
Y is selected form the group consisting of

and

Z is selected from the group consisting of

and

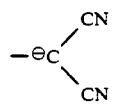

M⊖ is a cation, and
each R is independently selected from the group consisting of hydrogen and —NO₂.

12. A compound according to claim 11 having one of the following structures:

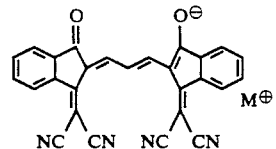

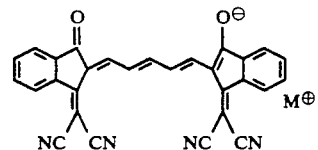

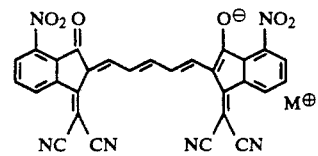

13. A compound according to claim 11 wherein:
M⊕ is selected from the group consisting of K⊕, N⊕H(C₂H₅)₃, N⊕H(C₄H₉)₃, N⊕H(C₈H₁₇)₃, N⊕H(C₁₈H₃₇)₃,

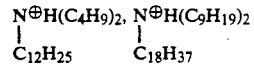

and pyridinium.

14. A photosensitive element comprising a layer of a photocurable composition comprising:
(a) a compound having the formula:

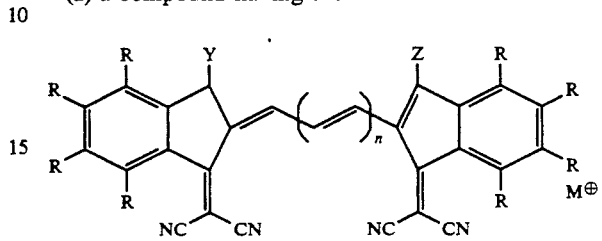

wherein:
n is 1 or 2,
Y is selected from the group consisting of

and

Z is selected from the group consisting of

and

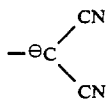

M+ is a cation,
R is independently selected from the group consisting of hydrogen and —NO₂,
(b) an iodonium salt, and
(c) a free-radical curable resin.

15. A photosensitive element according to claim 14 wherein
the compound of formula (I) comprises from 1 to 10% by weight of the total weight of the composition;
the iodonium salt comprises from 1 to 20% by weight of the total weight of the composition, and
the resin comprises 70 to 98% by weight of the total weight of the composition.

16. A photosensitive element according to claim 14 wherein the photocurable composition comprises a triarylphosphine.

17. A photosensitive element according to claim 16 wherein the triarylphosphine comprises up to 15% by weight of the total weight of the composition.

18. A photosensitive element according to claim 16 wherein the triarylphosphine is triphenylphosphine.

19. A photosensitive element according to claim 14 wherein the iodonium salt comprises a cation selected from the group consisting of:

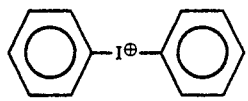

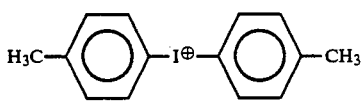

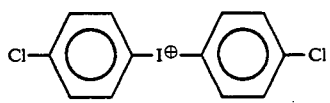

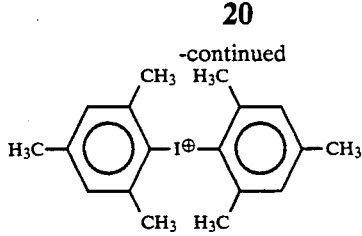

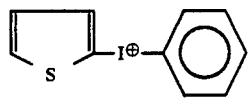

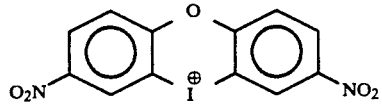

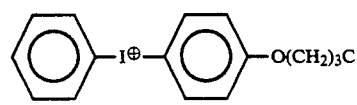

and an anion selected from the group consisting of $Cl^{\ominus}$, $Br^{\ominus}$, $SbF_6^{\ominus}$, $PF_6^{\ominus}$, $CF_3CO_2^{\ominus}$, $AsF_6^{\ominus}$, $HSO_4^{\ominus}$, $CF_3SO_3^{\ominus}$, $BF_4^{\ominus}$ and $C_7H_7SO_3^{\ominus}$.

* * * * *

UNITED STATES PATENT AND TRADEMARK OFFICE
CERTIFICATE OF CORRECTION

PATENT NO. : 5,208,135
DATED : May 4, 1993
INVENTOR(S) : Patel et al.

It is certified that error appears in the above-identified patent and that said Letters Patent is hereby corrected as shown below:

| | |
|---|---|
| Col. 3, line 67 | "⊖" should be -- ⊕ -- |
| Col. 4, line 63 | after "groups" add -- optionally substituted and optionally linked together to -- |
| Col. 4, line 66 | "⊕" should be -- ⊖ -- |
| Col. 9, line 19 | after "image" add -- . -- |
| Col. 14, line 24 | 'O⁼·' should be -- O⁻ -- |
| Col. 17, line 14 | "form" should be -- from -- |
| Col. 17, line 15 | " O " should be -- ‖ --<br>  ‖                              O |
| Col. 20, line 25 | "Br⁶³" should be -- Br⁻ -- |

Signed and Sealed this

Twenty-fifth Day of January, 1994

Attest:

BRUCE LEHMAN

*Attesting Officer*  Commissioner of Patents and Trademarks